(12) United States Patent
Nikitin et al.

(10) Patent No.: US 11,626,351 B2
(45) Date of Patent: Apr. 11, 2023

(54) SEMICONDUCTOR PACKAGE WITH BARRIER TO CONTAIN THERMAL INTERFACE MATERIAL

(71) Applicant: Infineon Technologies AG, Neubiberg (DE)

(72) Inventors: Ivan Nikitin, Regensburg (DE); Timo Bohnenberger, Neutraubling (DE); Andreas Grassmann, Regensburg (DE); Martin Mayer, Nittendorf (DE); Alexander Roth, Zeitlarn (DE); Franz Zollner, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/158,234

(22) Filed: Jan. 26, 2021

(65) Prior Publication Data
US 2022/0238422 A1 Jul. 28, 2022

(51) Int. Cl.
| | |
|---|---|
| *H01L 23/495* | (2006.01) |
| *H01L 21/48* | (2006.01) |
| *H01L 21/56* | (2006.01) |
| *H01L 23/28* | (2006.01) |
| *H01L 21/00* | (2006.01) |
| *H01L 23/31* | (2006.01) |
| *H01L 25/065* | (2023.01) |
| *H01L 25/07* | (2006.01) |

(Continued)

(52) U.S. Cl.
CPC .... *H01L 23/49568* (2013.01); *H01L 21/4825* (2013.01); *H01L 21/4871* (2013.01); *H01L 21/565* (2013.01); *H01L 23/28* (2013.01); *H01L 23/3107* (2013.01); *H01L 23/3114* (2013.01); *H01L 23/36* (2013.01); *H01L 23/49503* (2013.01); *H01L 23/49562* (2013.01); *H01L 24/83* (2013.01); *H01L 25/0652* (2013.01); *H01L 25/072* (2013.01); *H01L 2924/181* (2013.01)

(58) Field of Classification Search
CPC .......... H01L 2924/181; H01L 25/0652; H01L 25/072; H01L 23/28; H01L 23/49568; H01L 23/3114; H01L 23/49503; H01L 23/49562; H01L 21/565; H01L 21/4871; H01L 21/4825

See application file for complete search history.

(56) References Cited

U.S. PATENT DOCUMENTS

| | | | |
|---|---|---|---|
| 5,041,902 A * | 8/1991 | McShane | H01L 23/367 257/E23.047 |
| 9,093,434 B2 | 7/2015 | Kimura et al. | |
| 9,613,927 B2 | 4/2017 | Kimura et al. | |

(Continued)

*Primary Examiner* — Alonzo Chambliss
(74) *Attorney, Agent, or Firm* — Murphy, Bilak & Homiller, PLLC

(57) ABSTRACT

A semiconductor package includes a semiconductor die, an encapsulant body of electrically insulating material that encapsulates the semiconductor die, a thermal conduction plate comprising an outer surface that is exposed from the encapsulant body, a region of thermal interface material interposed between the thermal conduction plate and the semiconductor die, the region of thermal interface material being a liquid or semi-liquid, and a barrier that is configured to prevent the thermal interface material of the region from flowing laterally across the barrier.

15 Claims, 11 Drawing Sheets

(51) Int. Cl.
*H01L 23/36* (2006.01)
*H01L 23/00* (2006.01)

(56) References Cited

U.S. PATENT DOCUMENTS

| | | | |
|---|---|---|---|
| 2011/0084369 A1* | 4/2011 | Eder | H01L 24/29 |
| | | | 228/248.1 |
| 2012/0038033 A1* | 2/2012 | Oga | H01L 23/3107 |
| | | | 257/659 |
| 2015/0140736 A1* | 5/2015 | Pendse | H01L 24/92 |
| | | | 438/109 |

* cited by examiner

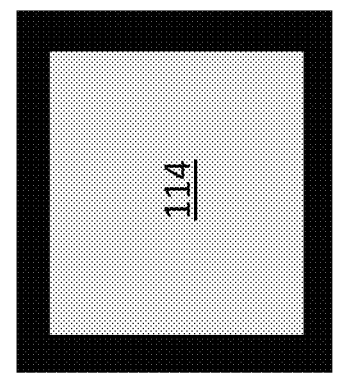
Fig. 4B
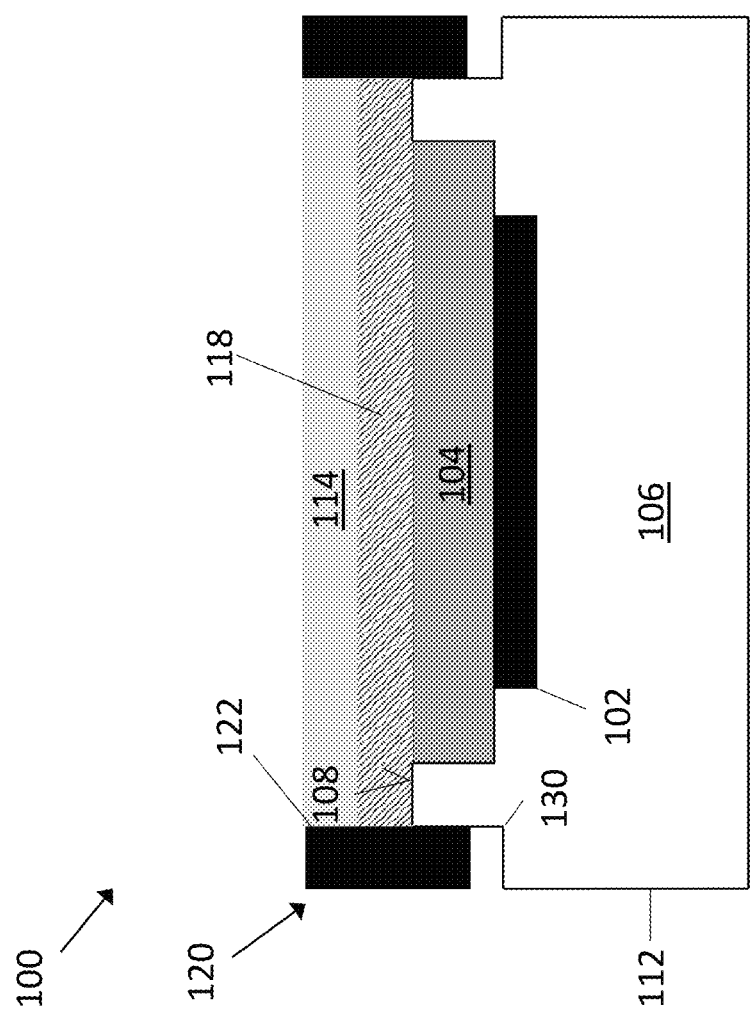
Fig. 4A
FIGURE 4

SEMICONDUCTOR PACKAGE WITH BARRIER TO CONTAIN THERMAL INTERFACE MATERIAL

TECHNICAL FIELD

The instant application relates to semiconductor devices, and particularly relates to power semiconductor devices that are configured to control large currents and/or voltages.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters. The semiconductor devices in these applications control very high voltages and/or high currents, e.g., voltages on the order of 500V (volts), 1000V or more and/or currents on the order of 1 A (ampere), 10 A or more.

A power module or power electronics module is used in power electronics applications to house multiple dies which form a power circuit. A power module typically includes a power electronics substrate, e.g., a direct bonded copper (DBC) substrate, an active metal braze (AMB) substrate, etc. This type of substrate includes an electrically insulating substrate of, e.g., ceramic, with structured regions of metallization (e.g., copper) formed on top of the electrically insulating substrate. The structured regions of metallization form electrically isolated islands that each semiconductor die is mounted on.

Thermal performance is an important design consideration in power applications. The isolated metal islands of the power electronic substrate may comprise or be configured as heat sinks to draw heat away from each semiconductor die. Moreover, separate heat sink structures may be mounted on top of each semiconductor die to draw away from the top surface of the semiconductor die. Particularly with respect to semiconductor die interfaces that require thermal dissipation but also require electrical isolation, efficient cooling can be challenging. The materials at these interfaces must have sufficient dielectric strength to withstand the large operational voltages of the power semiconductor devices. However, increasing the dielectric strength of materials, e.g., through increased material thickness or composition, typically comes at the expense of reduced thermal conduction. Accordingly, there is a need for cooling solutions with higher thermal conductivity while maintaining acceptable levels of electrical isolation.

SUMMARY

A semiconductor package is disclosed. According to an embodiment, the semiconductor package comprises a semiconductor die, an encapsulant body of electrically insulating material that encapsulates the semiconductor die, a thermal conduction plate comprising an outer surface that is exposed from the encapsulant body, a region of thermal interface material interposed between the thermal conduction plate and the semiconductor die, the region of thermal interface material being a liquid or semi-liquid, and a barrier that is configured to prevent the thermal interface material of the region from flowing laterally across the barrier.

Separately or in combination, the encapsulant body comprises a main surface, a rear surface opposite the main surface, and outer edge surfaces extending between the main surface and the rear surface, and wherein the barrier comprises an inner wall that extends transversely to the main surface and faces the thermal interface material.

Separately or in combination, the barrier is configured so that the inner wall forms an enclosed loop around the region of thermal interface material.

Separately or in combination, the barrier comprises an integrally formed feature of the encapsulant body.

Separately or in combination, the barrier comprises a protrusion of the encapsulant body that extends above the main surface, the inner wall of the barrier is a sidewall of the protrusion, and the thermal plate is mounted on top of the protrusion.

Separately or in combination, the barrier comprises a recess formed in the main surface of the encapsulant body, the inner wall of the barrier comprises a sidewall of the recess, and the region of thermal interface material is completely disposed below the main surface of the encapsulant body.

Separately or in combination, the barrier comprises an electrically insulating structure that is separate from the encapsulant body.

Separately or in combination, the encapsulant body comprises a ring-shaped recess formed in the main surface of the encapsulant body, and wherein the barrier comprises a molded ring that is fitted around the ring-shaped recess, and wherein the thermal conduction plate and the region of thermal interface material are laterally confined within the molded ring.

Separately or in combination, the semiconductor package further comprises a die pad, the semiconductor die is mounted on the die pad, a rear surface of the die pad that is opposite from the semiconductor die is exposed from the encapsulant body, and the region of thermal interface material directly interfaces with the first ceramic plate and the rear surface of the die pad.

Separately or in combination, the semiconductor package further comprises a second die pad, a second semiconductor die, a second region of the thermal interface material, and a region of electrical isolation material, the second semiconductor die is mounted on the second die pad, a rear surface of the second die pad that is opposite from the second semiconductor die is exposed from the encapsulant body, wherein the second region of the thermal interface material directly interfaces with the second ceramic plate and the second die pad, the region of electrical isolation material has a higher dielectric strength than the thermal interface material, and the region of electrical isolation material is laterally disposed between the region of the thermal interface material and the second region of the thermal interface material.

Separately or in combination, the semiconductor package further comprises a second thermal conduction plate comprising an outer surface that is exposed from the encapsulant body, a second region of the thermal interface material interposed between the second thermal conduction plate and the semiconductor die, and a second barrier that is configured to prevent the thermal interface material of the second region from flowing laterally across the second barrier, and the second thermal conduction plate is disposed on an opposite side of the encapsulant body as the thermal conduction plate.

Separately or in combination, the thermal interface material comprises an electrically insulating liquid matrix and one or both of: metal particles suspended in the liquid matrix, and metal wires suspended in the liquid matrix.

Separately or in combination, the metal particles and/or metal wires are coated with an electrically insulating material.

Separately or in combination, the thermal conduction plate is sintered body of ceramic material comprising any one or combination of a nitride ceramic, an oxide ceramic, a silicate ceramic, and a carbide material.

Separately or in combination, the thermal conduction plate comprises an organic insulation material.

Separately or in combination, the semiconductor package further comprises a frame extending from the main surface, and the frame comprises inner walls that face lateral edges of the thermal conduction plate.

A method of producing a semiconductor package is disclosed. According to an embodiment, the method comprises providing a semiconductor die, forming an encapsulant body of electrically insulating material that encapsulates the semiconductor die, forming a barrier, providing a thermal interface material that is liquid or semi-liquid, providing a thermal conduction plate that is electrically insulating and thermally conductive, and arranging the thermal conduction plate on the semiconductor package such that a first region of the thermal interface material is interposed between the thermal conduction plate and the semiconductor die, and after the arranging the barrier is configured to prevent thermal interface material of the first region from flowing laterally across the barrier.

Separately or in combination, the barrier is formed as an integrally formed feature of the encapsulant body.

Separately or in combination, forming the encapsulant body comprises a molding process, and forming the barrier comprises forming a recess or protrusion in the encapsulant body using the molding process.

Separately or in combination, the encapsulant body is formed by performing a first molding process, and the barrier is formed by performing a second molding process that is separate from first molding process.

Separately or in combination, arranging the thermal conduction plate on the semiconductor package comprises pre-coating a surface of the semiconductor package that is thermally coupled to the semiconductor die with the thermal interface material and subsequently placing the thermal conduction plate on top of the thermal interface material.

Separately or in combination, arranging the thermal conduction plate on the semiconductor package comprises pre-coating a surface of the thermal conduction plate with the thermal interface material and subsequently placing the thermal conduction plate on a surface of the semiconductor package that is thermally coupled to the semiconductor die.

Separately or in combination, the method comprising a second region of the thermal interface material over an outer surface of the thermal conduction plate that faces away from the encapsulant body after arranging the thermal conduction plate on the semiconductor package.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes FIGS. 4A and 4B, illustrates a semiconductor package with a barrier structure, according to an embodiment. FIG. 4A illustrates the semiconductor package from a cross-sectional perspective and FIG. 4B illustrates the semiconductor package from a plan-view perspective.

DETAILED DESCRIPTION

Embodiments of a semiconductor package with a cooling mechanism formed by a thermal conduction plate and a thermal interface material that are thermally coupled to a semiconductor die are disclosed herein. The thermal conduction plate is a rigid structure of electrically insulating material, e.g., ceramic. The thermal interface material is a liquid or semi-liquid material with relatively high thermal conductivity. The combination of the thermal conduction plate and the thermal interface material provide a thermal dissipation path with advantageously high thermal conductivity and robust dielectric strength. However, usage of thermal interface material in a liquid or semi-liquid state creates several problems if unaddressed. For example, the thermal conduction plate is prone to floating on the thermal interface material which may cause lateral displacement or complete separation of the thermal conduction plate. Moreover, the thermal interface material bleed past an edge of the thermal conduction plate and ultimately form in unwanted locations when the package is mounted. The presently disclosed semiconductor package advantageously includes a barrier structure that addresses these issues. The barrier structure has an arrangement and geometric configuration that prevent the lateral flow of the thermal interface material past the edge sides of the thermal conduction plate. In fact, the barrier structure can form a complete seal that encloses the thermal interface material and thus prevents it from accumulating in unwanted locations. Moreover, the barrier structure has an arrangement and geometric configuration that prevents the thermal conduction plate from laterally moving due to floating on the thermal interface material.

Figure 1:
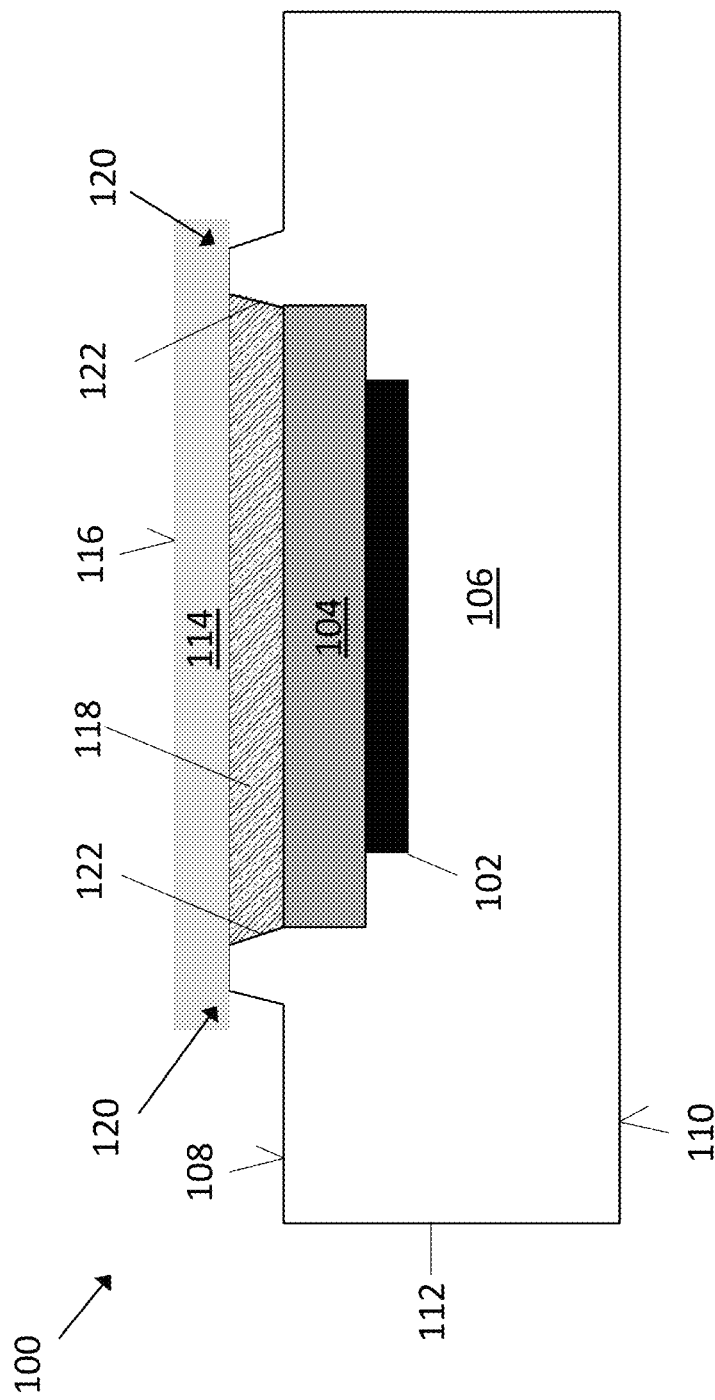
FIG. 1 illustrates a cross-sectional perspective of a semiconductor package with a barrier structure, according to an embodiment.

Referring to FIG. 1, a semiconductor package 100 comprises a semiconductor die 102. Generally speaking, the semiconductor die 102 can be any type of device. For example, the semiconductor die 102 can be configured as a discrete device, e.g., diode, transistor, thyristor, etc., or an integrated circuit, e.g., amplifier, driver, controller, etc. The semiconductor die 102 can comprise type IV semiconductor materials, e.g., as silicon, silicon germanium, silicon carbide, etc., and/or type III-V semiconductor materials, e.g., gallium nitride, gallium arsenide, etc. The semiconductor die 102 may be configured as a vertical device that is configured to control a current flowing between a main surface and an opposite facing rear surface, or a lateral device that is configured to control a current flowing parallel to a main surface.

According to an embodiment, the semiconductor die 102 is configured as a discrete power device. A discrete power device refers to a discrete component that is rated to accommodate voltages of at least 100V and more commonly on the order of 500V or more and/or currents of at least 1 A and more commonly on the order of 10 A or more. Examples of discrete power devices include MOSFETs (Metal Oxide Semiconductor Field Effect Transistors), IGBTs (Insulated Gate Bipolar Transistors), and HEMTs (High Electron Mobility Transistors), for example.

The semiconductor die 102 is mounted on a die pad 104. The die pad 104 comprises a thermally conductive material such as copper, aluminum, nickel, iron, zinc, etc., and alloys thereof. A rear surface of the semiconductor die 102 can be attached to a die attach surface of the die pad 104 by an adhesive, e.g., solder, conductive glue, tape, etc. The semiconductor package 100 may further comprise conductive leads or contacts (not shown) that are externally accessible points of electrical connection to the device. The die pad 104 and these leads can be part of a common lead frame structure. The terminals of the semiconductor die 102, e.g., gate, source, emitter, etc., can be electrically connected to the leads or contacts by interconnect structures (not shown) such as bond wires, clips, ribbons, etc. In an embodiment, the semiconductor die 102 is a laterally configured device wherein each of the device terminals are disposed on a main surface of the semiconductor die 102 that faces away from the die pad 104. In that case, the rear surface of the semiconductor die 102 which contacts the die pad 104 is electrically inactive.

The semiconductor package 100 further comprises an encapsulant body 106 that encapsulates the semiconductor die 102, i.e., protects and surrounds the semiconductor die 102. The encapsulant body 106 is formed from an electrically insulating material. Examples of these materials include ceramics, epoxy materials, thermosetting plastics, glass-reinforced epoxy laminate material, etc. The encapsulant body 106 comprises a main surface 108, a rear surface 110 opposite the main surface 108, and outer edge surfaces 112 extending between the main surface 108 and the rear surface 110. The semiconductor package 100 can be mounted on a circuit carrier, e.g., power electronic substrate, PCB, etc., with the main surface 108 facing the circuit carrier and the rear surface 110 facing away from the circuit carrier. In this arrangement, the main surface 108 and the rear surfaces 110 can be substantially parallel to the mounting surface of the circuit carrier.

The semiconductor package 100 further comprises a thermal conduction plate 114. The thermal conduction plate 114 comprises an outer surface 116 that is exposed from the encapsulant body 106 and is substantially parallel to the main surface 108. In a mounted configuration of the semiconductor package 100, the outer surface 116 of the thermal conduction plate 114 interfaces with a conductive bond pad or heat sink structure to draw heat away from the semiconductor package 100. As shown, the thermal conduction plate 114 has a rectangular cubic shape. More generally, the thermal conduction plate 114 can have a variety of different geometries.

The thermal conduction plate 114 is a rigid structure of electrically insulating material. The thermal conduction plate 114 may have thickness and material composition that is designed to withstand voltages on the order of 500 v, 1 kV, 5 kV or more across a thickness of the thermal conduction plate 114. Stated another way, the thermal conduction plate 114 may have sufficient breakdown strength to withstand the maximum operating voltages of the semiconductor die 102 to which it is thermally coupled to. Generally speaking, the dielectric strength of the thermal conduction plate 114 can be on the order of at least 1 kV/mm, at least 5 kV/mm, at least 10 kV/mm, etc., which correspond to electric fields commonly associated with power applications. Meanwhile, the material composition of the thermal conduction plate 114 should be selected to provide relatively high thermal conductivity while meeting the above-described dielectric breakdown requirements. For example, the thermal conduction plate 114 can have a thermal conductivity of at least 1 W/mK (watts per meter-Kelvin), and more preferably at least 10 W/mK.

Exemplary materials for the thermal conduction plate 114 that meet the above-described dielectric strength and thermal conductivity requirements at acceptable thicknesses include ceramics such as $AlO_2$ (aluminum oxide), AlN (aluminum nitride), BN (boron nitride), SN (silicon nitride) and insulating plastics such as typical PCB materials (e.g., FR-4). In an embodiment, the thermal conduction plate 114 is a sintered body of ceramic material comprising any one or combination of: a nitride-based ceramic, e.g., $Si_3N_4$, AlN, BN, an oxide-based ceramic, e.g., MgO, ZrO, BeO, ZTA, $Al_2O_3$, AlTi, a silicate ceramic, e.g., porcelain, steatite, cordierite, mullite, etc., and carbon-based ceramic such as SiC and $B_4C$. Instead of a sintered body, any one or combination of the above listed ceramic materials can be provided as part of an insulating polymer matrix. The thermal conduction plate 114 may comprise organic insulation materials, e.g., epoxy or acrylic materials with, e.g., ceramic particles or ceramic coated metal particles for better thermal conductivity. The thermal conduction plate 114 may be a multi-layer structure, with only some or one of these layers being an electrical insulator.

Generally speaking, the thermal conduction plate 114 may have a thickness of between about 100 μm and 1000 μm. The thickness is measured between an inner surface of the thermal conduction plate 114 that faces the semiconductor die 102 and the outer surface 116 of the thermal conduction plate 114. In one specific embodiment, the thermal conduction plate 114 comprises or is formed from $Al_2O_3$ and has a thickness of between about 250 μm and 650 μm. In another specific embodiment, the thermal conduction plate 114 comprises or is formed from AlN and has a thickness of between about 380 μm and 1000 μm. In another specific embodiment, the thermal conduction plate 114 comprises or is formed from $Si_3N_4$ and has a thickness of between about 150 μm and 635 μm.

The semiconductor package 100 further comprises a region of thermal interface material 118 interposed between the semiconductor die 102 and the thermal conduction plate 114. The thermal interface material 118 thermally couples the thermal conduction plate 114 to the semiconductor die 102. To this end, the thermal interface material 118 may have a thermal conductivity of between 1 W/mK and 20 W/mK, and more preferably at least 3 W/mK. As shown, the region of thermal interface material 118 directly interfaces with (i.e., contacts) the first ceramic plate and the rear surface 110 of the die pad 104, which in turn provides a low (thermal) resistance connection with the semiconductor die 102.

According to an embodiment, the thermal interface material 118 is a liquid or semi-liquid. This means that at room temperature the thermal interface material 118 has a dynamic viscosity of no greater than 75,000 mm$^2$/s (square millimeter per second). This encompasses commercially available thermal interface liquids and pastes (e.g., so-called "thermal grease") but does not encompass other types of thermal intermediary materials that cure or harden at room temperature such as epoxy-based thermal adhesives or phase change material.

A liquid or semi-liquid or thermal interface material 118 that meets the above-described thermal conductivity criteria may comprise a polymerizable liquid matrix in combination with an electrically insulating and thermally conductive filler. The liquid matrix may include silicone, urethane, and acrylates; solvent-based systems, hot-melt adhesives, for example. The filler may include aluminum nitride aluminum oxide, boron nitride, zinc oxide. The amount of filler can be in the range of 70-80% by mass, for example. According to an embodiment, the thermal interface material 118 may comprise thermally conductive particles (round or elongated), e.g., silver particles, copper particles, aluminum particles, etc. and combinations thereof, that are suspended in a liquid matrix. Additionally, or alternatively, the thermal interface material 118 may comprise thermally conductive wires (e.g., copper wires, aluminum wires, etc.) with an insulating coating of, e.g., polymer material, that are suspended in a liquid matrix. Generally speaking, increasing the content of thermally conductive particles or wires leads to a favorable increase in thermal conductivity of the thermal interface material 118.

The semiconductor package 100 additionally includes a barrier 120. The barrier 120 is configured to prevent the thermal interface material 118 from flowing laterally across the barrier 120. That is, the barrier 120 has the necessary geometric configuration to inhibit lateral movement of a volume of liquid or semi-liquid material. To this end, the barrier 120 comprises an inner wall 122 that faces the region of thermal interface material 118 and is arranged to oppose the lateral flow of the thermal interface material 118 across the main surface 108 of the encapsulant body 106. The inner wall 122 extends transversely to the main surface 108 of the encapsulant body 106. As shown, the inner wall 122 is a planar surface that is oriented at a non-perpendicular angle relative to the main surface 108. More generally, the inner wall 122 can be oriented at different angles than what is shown and may have different geometries, e.g., curved, beveled, etc., provided that the height and orientation of the inner wall 122 is sufficient to confine the thermal interface material 118. The height of the barrier 120, which corresponds to a vertical displacement of the barrier 120 relative to the main surface 108, may generally be in the range of 50 μm to 500 μm, for example.

In the depicted embodiment, the barrier 120 is formed by a protrusion that extends above the first outer surface 116, wherein the inner wall 122 of the barrier 120 corresponds to a sidewall of this protrusion. Stated another way, the barrier 120 is configured as a flange structure that extends upward from the main surface 108 of the encapsulant body 106. The protrusion can be an integrally formed feature of the encapsulant body 106. That is, the protrusion can be a constituent feature of the electrically insulating material (e.g., mold compound) that forms the encapsulant body 106. Alternatively, this protrusion can be provided by a separate structure that is formed on or attached to the main surface 108.

In another embodiment, the die pad 104 may be omitted from the semiconductor package 100. In that case, the rear surface of the semiconductor die 102 may be directly exposed at the main surface 108 of the encapsulant body 106. In this embodiment, the thermal interface material 118 can be formed directly on the rear surface 110 of the semiconductor die 102 and thus directly thermally couple the semiconductor die 102 to the thermal conduction plate 114.

Figure 2:
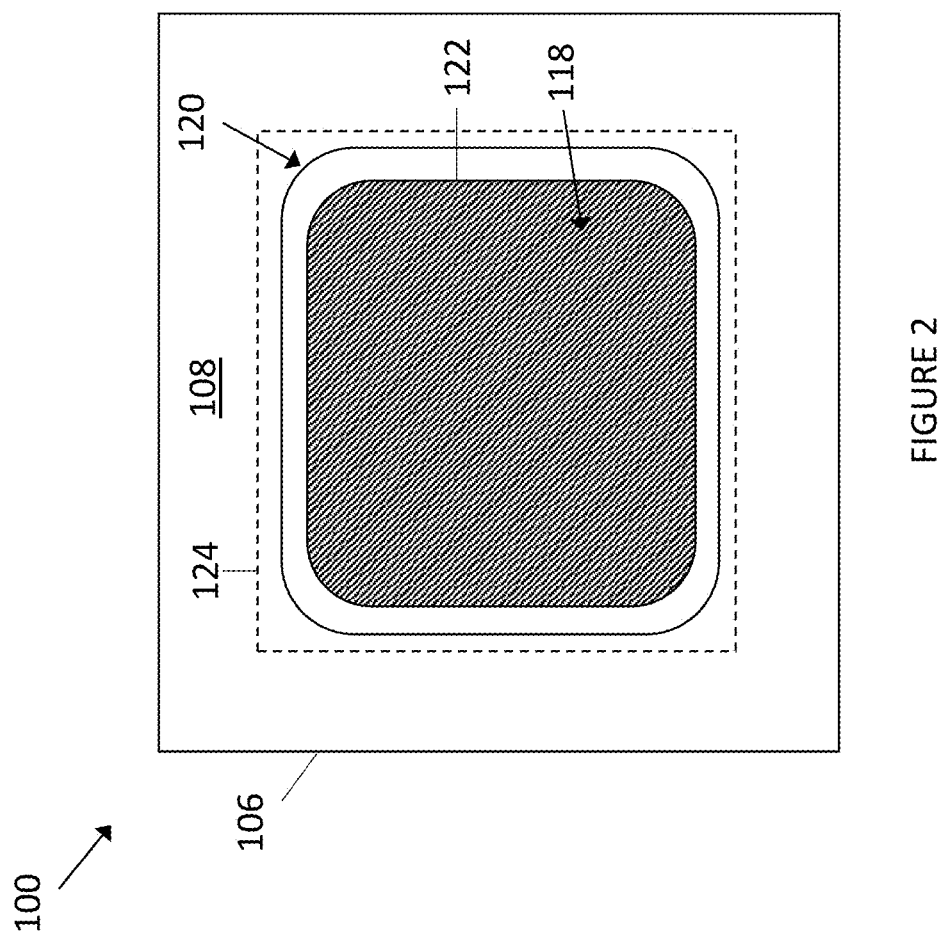
FIG. 2 illustrates a plan-view perspective of a semiconductor package with a barrier structure, according to an embodiment.

Referring to FIG. 2, a plan-view of the semiconductor package 100 is depicted, according to an embodiment. In this figure, only an outline 124 of the thermal conduction plate 114 is shown. As can be seen, the barrier 120 is configured so that the inner wall 122 forms an enclosed loop around the region of thermal interface material 118. As a result, the barrier 120 completely laterally confines the thermal interface material 118. When the thermal conduction plate 114 is mounted on top of the barrier 120, the thermal interface material 118 is sealed within an enclosed volume. The depicted enclosed ring geometry of the barrier 120 represents just one potential geometry, and other geometries are possible such as a completely rectangular-shaped geometry, circular geometry, etc.

By using a liquid or semi-liquid thermal interface material 118, the thermal resistance between the semiconductor die 102 and the thermal conduction plate 114 can be advantageously lowered in comparison to solid thermal intermediary materials such as cured epoxy. The barrier 120 advantageously mitigates issues associated with the liquid or semi-liquid state of the thermal interface material 118. In particular, by sealing the thermal interface material 118 in the above-described manner, the semiconductor package 100 can be transported or repositioned without causing the thermal interface material 118 to bleed past the lateral edges of the thermal conduction plate 114. Additionally, the barrier 120 provides an anchor mechanism between the thermal conduction plate 114 and the encapsulant body 106 that maintains the lateral position of the thermal conduction plate 114. This reduces the susceptibility of the thermal conduction plate 114 to lateral movement by floating on the thermal interface material 118. The barrier 120 therefore eliminates the need to perform additional steps to accommodate the usage of liquid or semi-liquid thermal interface material 118, such as repositioning of the thermal conduction plate 114 and/or removal of thermal interface material 118 in unwanted locations.

Figure 3:
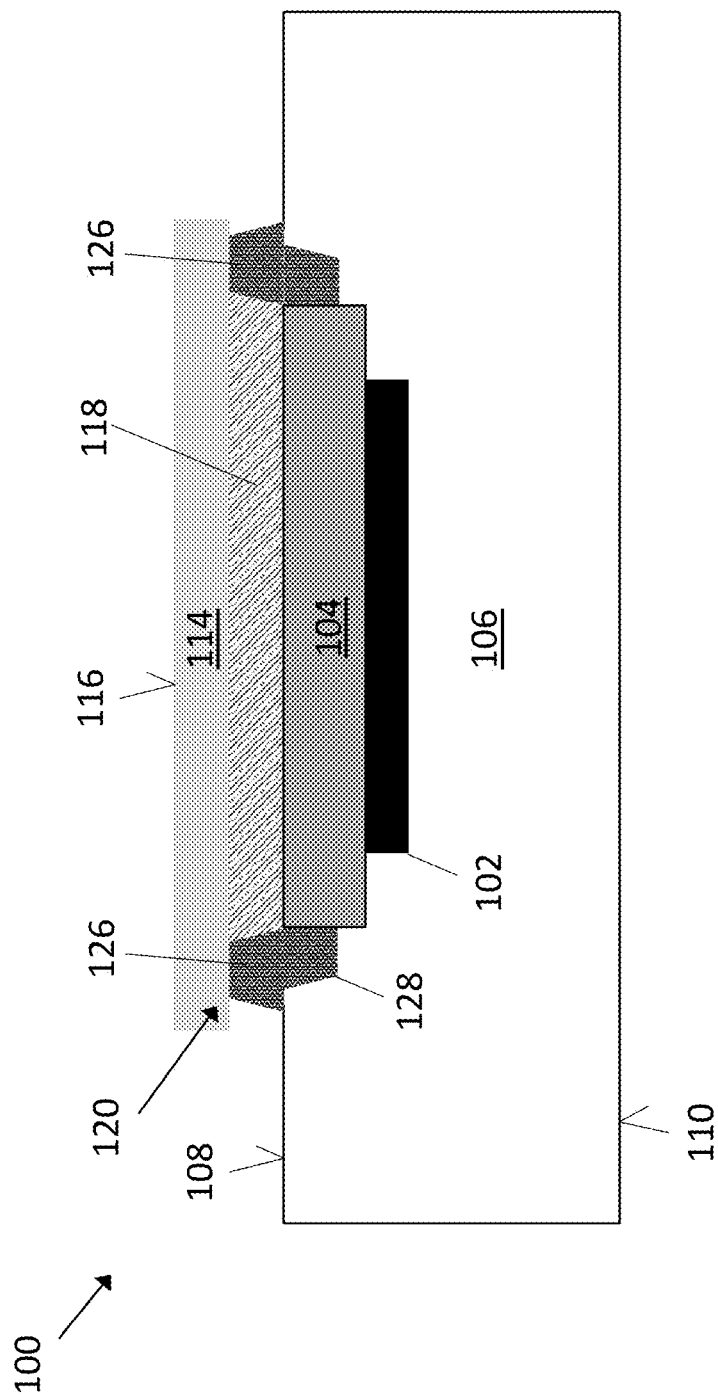
FIG. 3 illustrates a cross-sectional perspective of a semiconductor package with a barrier structure, according to an embodiment.

Referring to FIG. 3, the semiconductor package 100 is depicted, according to another embodiment. In this embodiment, the barrier 120 is provided by an electrically insulating structure that is separate from the encapsulant body 106. In this example, an electrical isolation material 126 such as a silicone gel is formed the encapsulant body 106. This electrical isolation material 126 can be formed to have the geometric configuration of the barrier 120 described above, e.g., a protrusion or flange-like structure that forms an enclosed loop from a plan-view perspective. As a result, the barrier 120 can inhibit the flow of the thermal interface material 118 and seal the thermal interface material 118 in the above-described manner. Optionally, a recess 128 may be provided in the main surface 108 of the encapsulant body 106 around the die pad 104, and the electrical isolation material 126 may be provided within this recess 128. This arrangement may further enhance the sealing effect of the electrical isolation material 126 by eliminating an interface by which small amounts of the thermal interface material 118 can escape.

Referring to FIG. 4, the semiconductor package 100 is depicted, according to another embodiment. Similar to the embodiment of FIG. 3, in this embodiment the barrier 120 is provided by an electrically insulating structure that is separate from the encapsulant body 106. In this example, the barrier 120 is provided by a rigid structure of electrically insulating material, e.g., plastic, ceramic, glass, etc. that is formed in the shape of an enclosed ring. In an embodiment, this rigid structure is a molded ring of, e.g., epoxy material. The encapsulant body 106 is structured to include a corresponding ring-shaped recess 130 that engages with the ring-shaped barrier 120. As shown, this ring-shaped recess 130 is formed at the outer periphery of the encapsulant body 106 where the main surface 108 intersects the outer edge surfaces 112. In other embodiments, one or multiple ones of these ring-shaped recess 130 can be formed in a smaller area of the main surface 108 that is separated from the outer edge surfaces 112. The pre-formed ring-shaped barrier 120 structure can be fitted into the ring-shaped recess 130 and attached to the encapsulant body 106 using an adhesive such as glue. The thermal interface material 118 and the thermal conduction plate the thermal conduction plate and the region of thermal interface material are laterally confined within the area enclosed the ring-shaped barrier 120 structure. One advantage of this arrangement is that the barrier 120 structure is well-suited to prevent lateral movement of the thermal conduction plate 114 because the inner wall 122 of the barrier 120 structure faces the lateral edge of the thermal conduction plate 114. Another advantage of this embodiment is that the barrier 120 and the thermal conduction plate 114 collectively form a continuous planar side of the semiconductor package 100 that can be interfaced with a corresponding planar surface from e.g., a heat sink or power module substrate.

Figure 5:
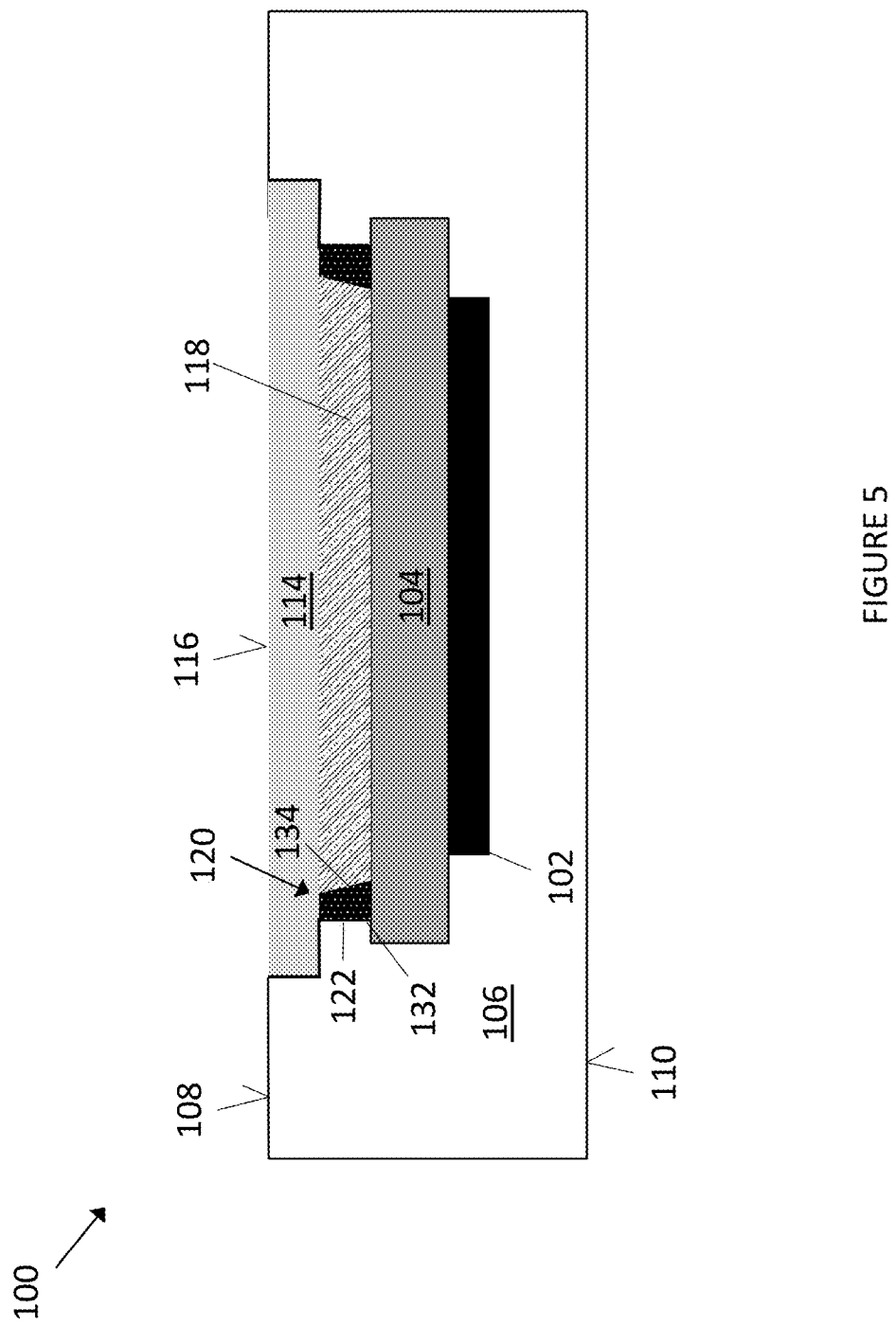
FIG. 5 illustrates a cross-sectional perspective of a semiconductor package with a barrier structure, according to an embodiment.

Referring to FIG. 5, the semiconductor package 100 is depicted, according to another embodiment. In this embodiment the barrier 120 comprises an integrally formed feature of the encapsulant body 106. In this case, the integrally formed feature is a recess 132 that is formed in the main surface 108 of the encapsulant body 106 and extends into the encapsulant body 106 towards the semiconductor die 102. The inner wall 122 of the barrier 120 corresponds to a sidewall of the recess 132. The semiconductor package 100 may further comprise electrical isolation material 134, e.g., a silicone gel, formed along the sidewall of the recess 132. This concept enables the thermal interface material 118 to be disposed below the main surface 108 of the encapsulant body 106, which in turn allows the outer surface 116 of the thermal conduction plate 114 to be substantially coplanar with the main surface 108 of the encapsulant body 106. As a result, the outer surface 116 of the thermal conduction plate 114 and the main surface 108 of the encapsulant body 106 collectively form a continuous planar side of the semiconductor package 100 that can be interfaced with a corresponding planar surface from e.g., a heat sink or power module substrate.

Figure 6:
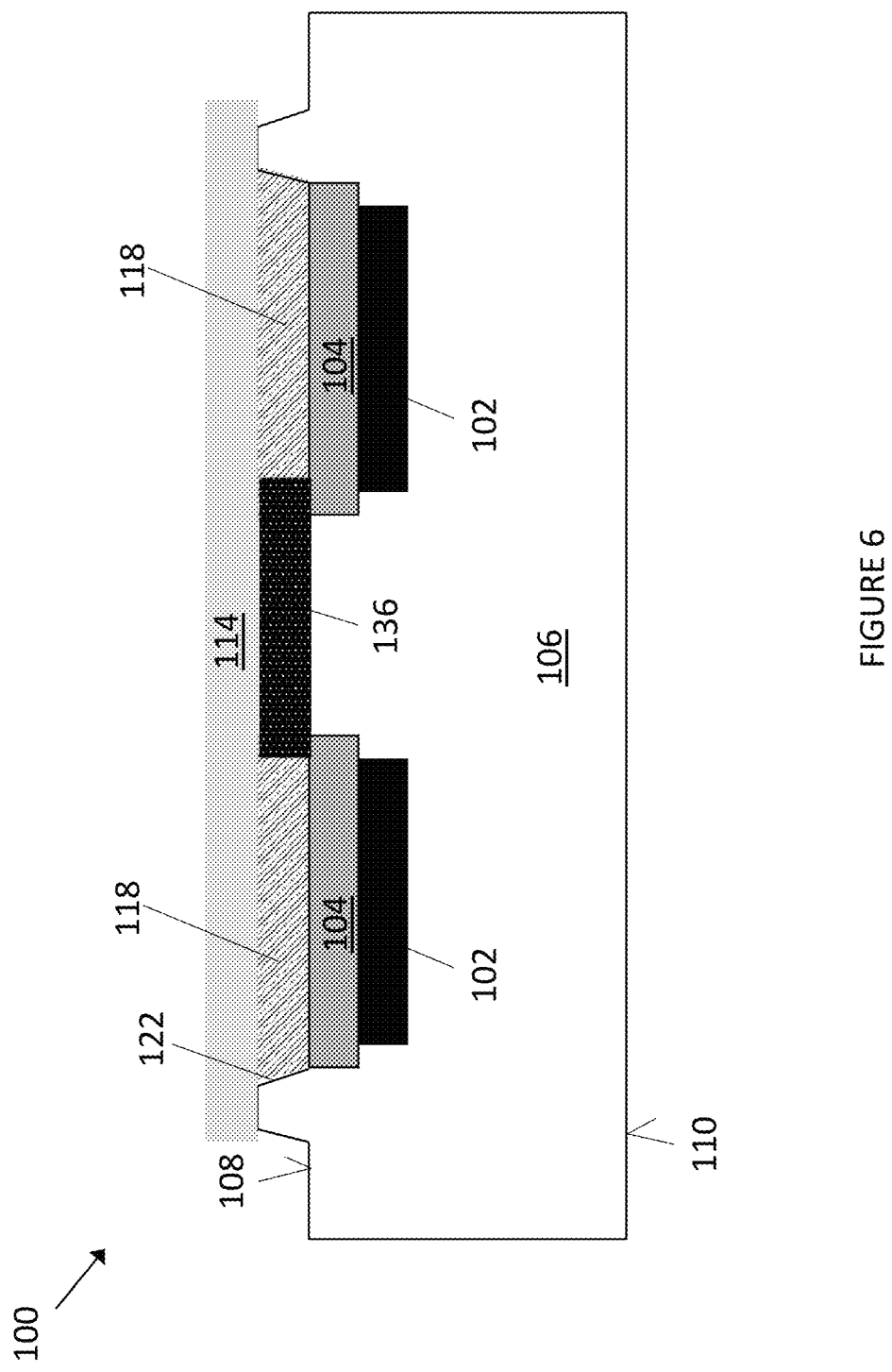
FIG. 6 illustrates a cross-sectional perspective of a semiconductor package with a barrier structure, according to an embodiment.

Referring to FIG. 6, the semiconductor package 100 is depicted, according to another embodiment. In this embodiment, the semiconductor package 100 is configured as a multi-die package with a pair of the semiconductor dies 102. Each of the dies 102 are mounted on separate die pads 104, with the rear surfaces of these die pads 104 being exposed from the main surface 108 of the encapsulant body 106 in a similar manner as previously described. The semiconductor dies 102 can have any of the previously described device configurations and may have the same or different configuration from one another. In one embodiment, both of the semiconductor dies 102 are power transistor dies (e.g., MOSFETs or IGBTs) that are packaged in a half-bridge configuration.

In this embodiment, the semiconductor package 100 includes a single thermal conduction plate 114 that is used to provide a thermal dissipation path for both of the semiconductor dies 102. A region of the thermal interface material 118 is provided between each of the die pads 104 and the thermal conduction plate 114. The barrier 120 of the semiconductor package 100 can be arranged in an enclosed ring around both of the regions of thermal interface material 118, thereby providing the above-described sealing effect. While the depicted embodiment shows a barrier 120 configuration resembling that of FIG. 1, any of the other barrier 120 configurations disclosed herein may be used instead.

A region of electrical isolation material 136 with a higher dielectric strength than the thermal interface material 118 is provided between the two regions of thermal interface material 118. For instance, the electrical isolation material 136 may be a silica gel, which can support substantially larger voltage drops than a corresponding thickness of thermal interface material 118. This can be advantageous or necessary in the case that the two semiconductor dies 102 are power devices such as the above-described half-bridge circuit configuration. Because the electrical isolation material 136 is disposed mainly outside of the thermal transmission path between the die pads 104 and the thermal conduction plate 114, any differences in thermal conductivity between the materials have a minimal impact on the thermal performance of the semiconductor package 100.

Figure 7:
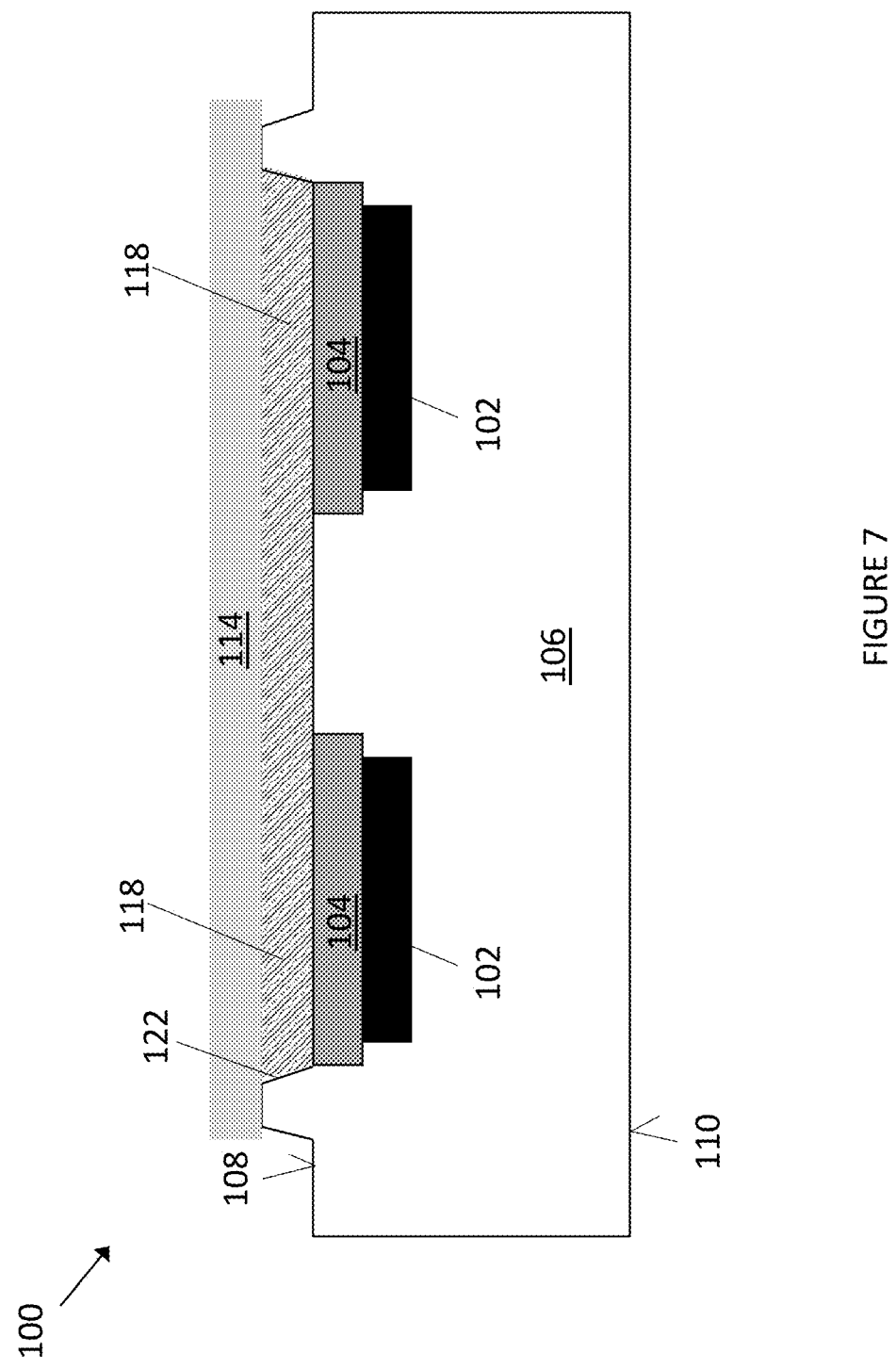
FIG. 7 illustrates a cross-sectional perspective of a semiconductor package with a barrier structure, according to an embodiment.

Referring to FIG. 7, the semiconductor package 100 is depicted, according to another embodiment. In this embodiment, the semiconductor package 100 is substantially identical to that of FIG. 6, except that the region of electrical isolation material 136 is omitted. Instead, a continuous region of the thermal interface material 118 is contained by the barrier 120. This arrangement may be preferable in comparison to the embodiment of FIG. 6 to reduce cost and/complexity if, for instance, there is not a large voltage drop between the two dies semiconductor dies 102.

Figure 8:
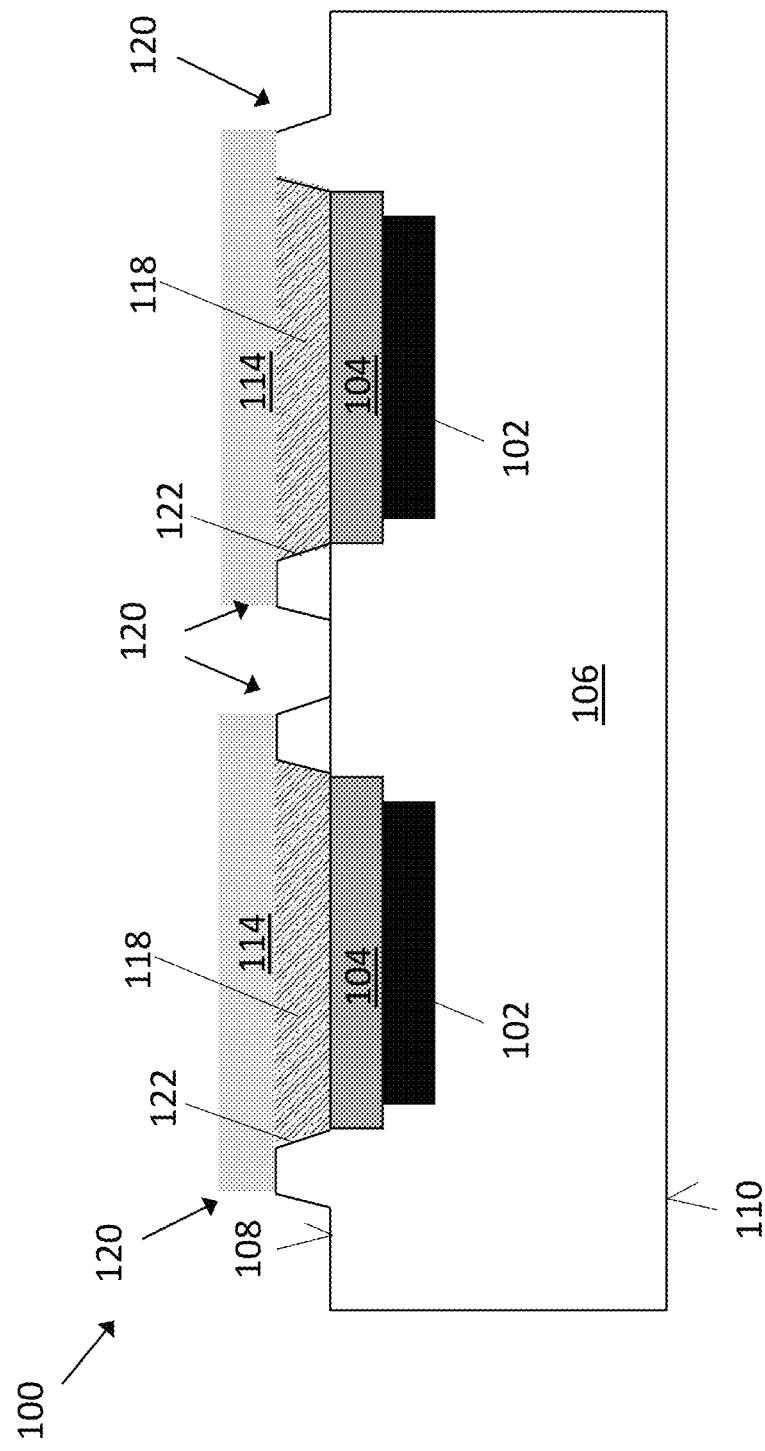
FIG. 8 illustrates a cross-sectional perspective of a semiconductor package with a barrier structure, according to an embodiment.

Referring to FIG. 8, the semiconductor package 100 is depicted, according to another embodiment. In this embodiment, the semiconductor package 100 is substantially identical to that of FIG. 6, except that the semiconductor package 100 includes two separate thermal conduction plates 114. Each thermal conduction plate 114 is associated with one of the die pads 104, and a separate barrier 120 and region of the thermal interface material 118 is provided between each thermal conduction plate 114 and die pad 104, thereby providing a thermal dissipation path for each semiconductor die 102. This arrangement represents another way to provide significant electrical and/or thermal isolation between the two semiconductor dies 102.

Figure 9:
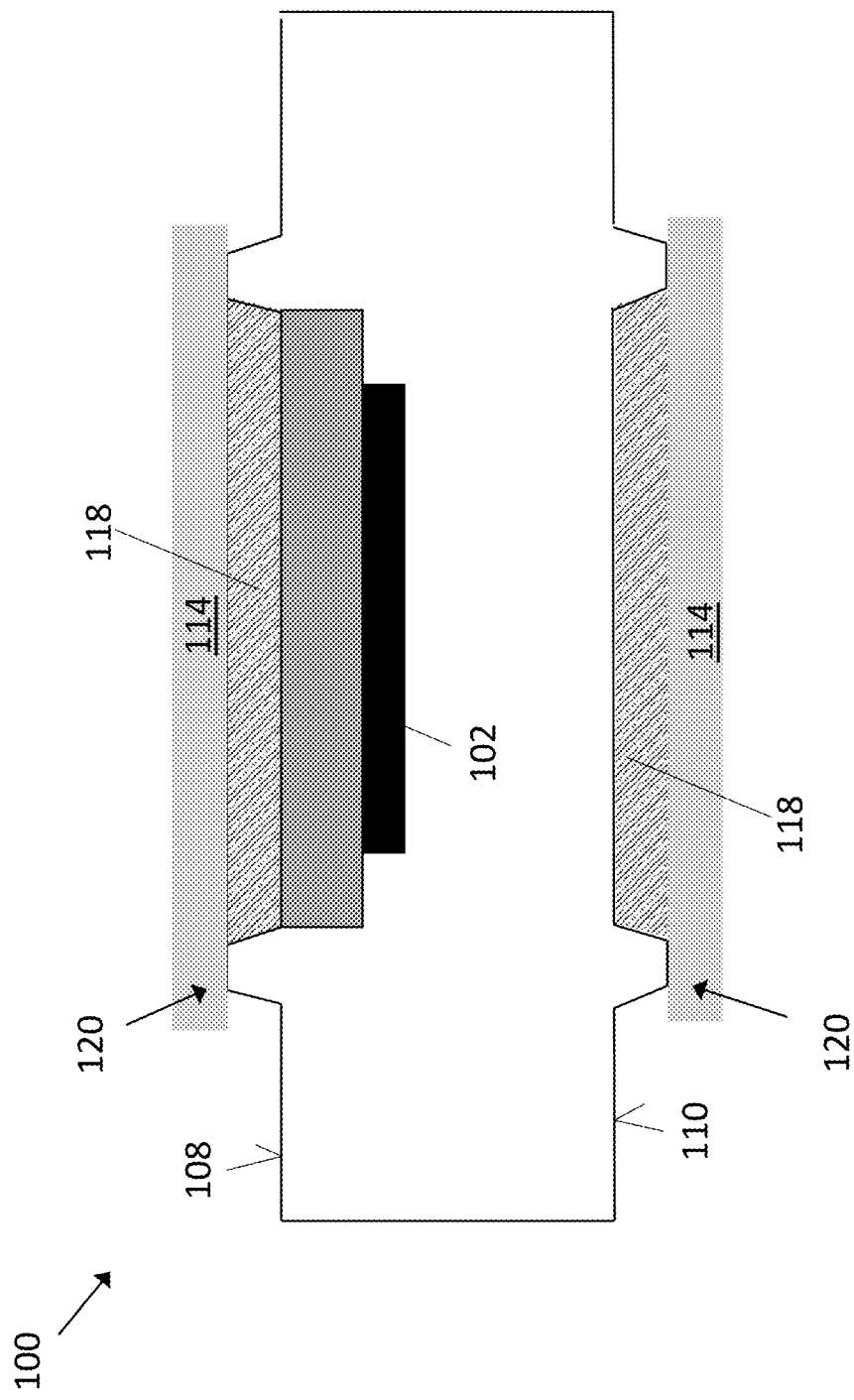
FIG. 9 illustrates a cross-sectional perspective of a semiconductor package with a barrier structure, according to an embodiment.

Referring to FIG. 9, the semiconductor package 100 is depicted, according to another embodiment. In this embodiment, a combined structure including the thermal interface material 118, the thermal conduction plate 114 and the barrier 120 are additionally provided at the rear surface 110 of the encapsulant body 106. This provides a two-sided cooling configuration wherein the semiconductor package 100 can be interfaced with a heat sink or power module substrate on both sides of the semiconductor package 100. While the depicted embodiment shows the barrier 120 having the same configuration as the embodiment of FIG. 1, any of the barrier 120 configurations disclosed herein can be employed in this two-sided configuration. Additionally, the semiconductor package 100 may comprise differently configured barriers 120 as between the main and rear surfaces 108, 110 of the semiconductor package 100.

Figure 10:
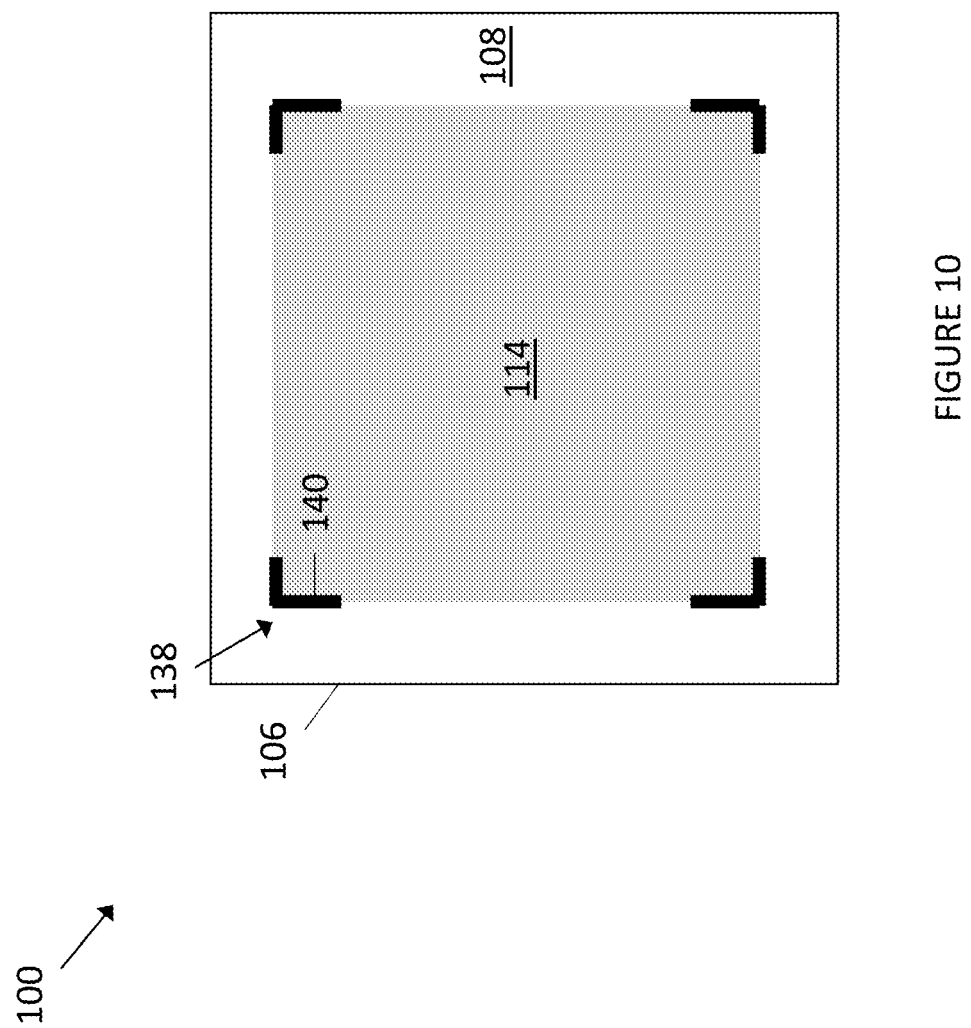
FIG. 10 illustrates a cross-sectional perspective of a semiconductor package with a frame structure, according to an embodiment.

Referring to FIG. 10, the semiconductor package 100 is depicted, according to another embodiment. As seen in the plan-view perspective, a frame 138 is provided on the main surface 108. The frame 138 comprises inner walls 140 that face and engage with the lateral edges of the thermal conduction plate 114. The frame 138 can be provided by a protrusion that is an integrally formed feature of the encapsulant body 106. Alternatively, the frame 138 can be a separate structure that is attached to or formed on the encapsulant body 106. The frame 138 substantially prevents lateral movement of the thermal conduction plate 114 and thus addresses the problem of the thermal conduction plate 114 floating on the thermal interface material 118. The frame 138 can be provided in addition to the barrier 120 according to the above-described embodiments. Alternatively, only the frame 138 can be provided in an application wherein sealing of the thermal interface material 118 is not necessary.

Figure 11:
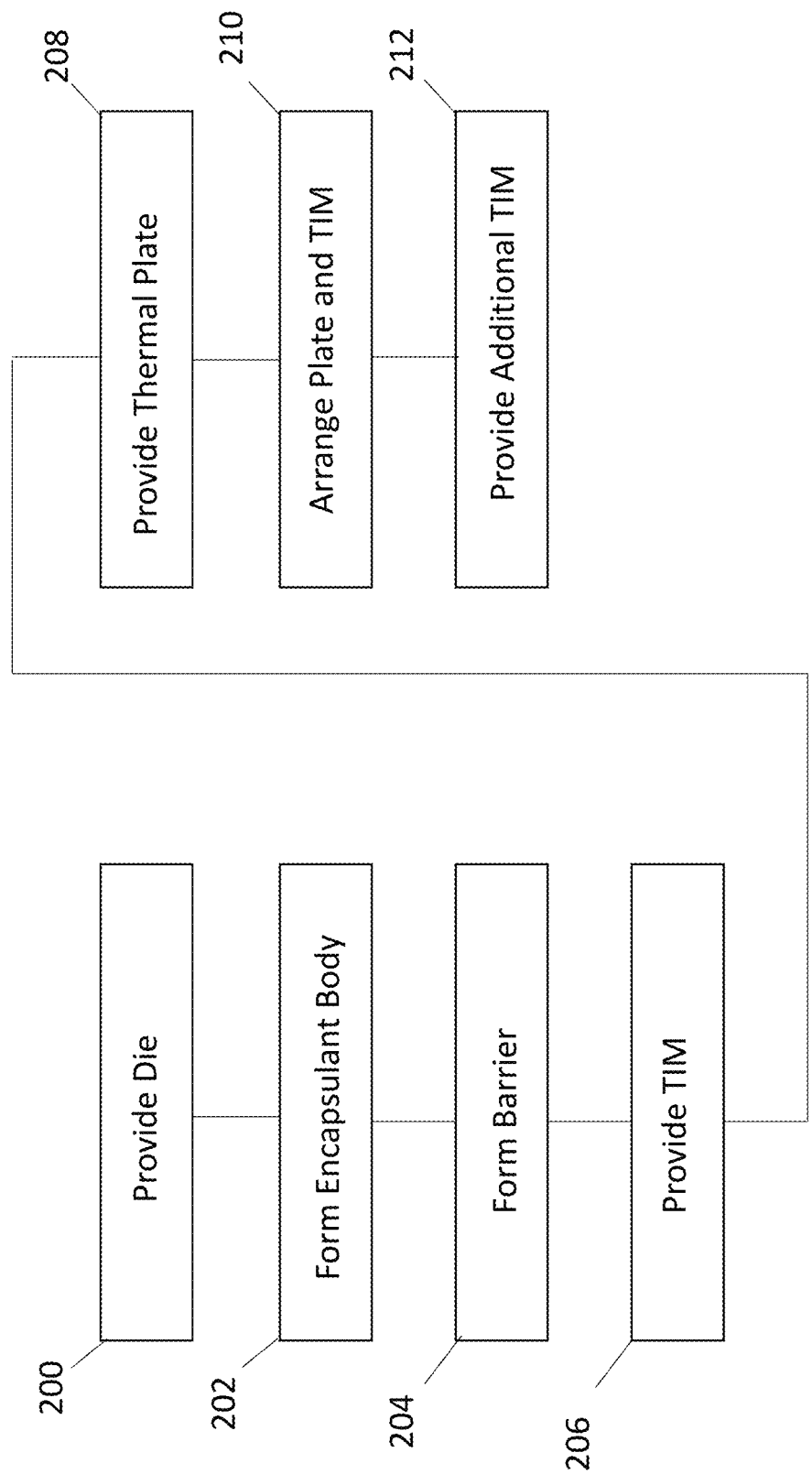
FIG. 11 illustrates a process sequence of a method of forming a semiconductor package with a barrier that prohibits movement of thermal interface material, according to an embodiment.

Referring to FIG. 11, selected steps of a method of producing the semiconductor package 100 according to any one of the above-described embodiments is depicted.

In a first process step 200, the semiconductor die 102 is provided.

In a second process step 202, the encapsulant body 106 is formed. According to an embodiment, the encapsulant body 106 is formed by a molding technique, e.g., injection molding, compression molding, transfer molding, etc. In another embodiment, the encapsulant body 106 is formed by a lamination technique. In either case, the encapsulant body 106 is formed to comprise the main and rear surfaces 108, 112 and outer edge surface 112 as disclosed herein, with the semiconductor die 102 being encapsulated within the encapsulant body 106. In an embodiment that includes the die pad 104, the rear surface of the die pad 104 can be exposed from the main surface 108 through appropriate configuration of the mold cavity and/or by initially covering the die pad 104 with encapsulant material and subsequently performing a polishing or grinding step.

In a third process step 204, the barrier 120 is formed on the semiconductor package 100. The barrier 120 can be formed in a variety of different ways. As previously discussed, the barrier 120 can be formed as an integrally formed feature of the encapsulant body 106. In one example of this, the barrier 120 can be formed concurrently during the same molding process that forms the encapsulant body 106. In this case, the geometry of the mold cavity is tailored such that a semiconductor package 100 having the barrier 120 forms once the mold compound is hardened. In another example, the encapsulant body 106 is initially formed as a generally cubic structure by either molding or lamination, and the features of the barrier 120 can be subsequently created in the main surface 108 of the encapsulant body 106, e.g., by performing a grinding step or other type of reductive processing step. Alternatively, the barrier 120 can be formed separately from the encapsulant body 106. In one example of this, the encapsulant body 106 is formed by a first molding process and the barrier 120 is formed by performing a second molding process after the first molding process. The first molding process forms the encapsulant body 106 to comprise the main and rear surfaces 108, 112 and outer edge surface 112 as disclosed herein, with the semiconductor die 102 being encapsulated within the encapsulant body 106. Subsequently, further process steps may be performed. These further processing steps may comprise lead frame separation and metal plating of the package leads as well as application of the thermal interface material 118. Subsequently, the barrier 120 may be formed by a second molding process that is performed directly on the encapsulant body 106. For example, once the thermal conduction plate 114 is arranged on the on the semiconductor package 100, the second molding process may comprise a compression molding technique that forms the barrier 120 directly on the main surface 108 of the encapsulant body 106. In another example, the second molding process may comprise prefabricating a ring like structure, e.g., as disclosed with reference to FIG. 4, before or after performing the first molding process that forms the encapsulant body 106. In yet another embodiment, the barrier 120 is formed as a separate feature from the encapsulant body 106 without any molding processes. For example, a ring-shaped structure of silicone gel may be formed on the encapsulant body 106 e.g., as shown in FIG. 3 before or after placement of the thermal interface material 118 and the thermal conduction plate 114.

In a fourth process step 206, the thermal interface material 118 is provided.

In a fifth process step 208, the thermal conduction plate 114 is provided. Optionally, a metallization layer (not shown) may be provided on the thermal conduction plate 114. The metallization layer may be provided at least on the outer surface 116 of the thermal conduction plate 114 and may be formed on all surfaces. This metallization layer offers the following benefits. Providing a metallization layer between the thermal conduction plate 114 and the thermal interface material 118 provides more uniform distribution of electric field during operation of the device. This enhances the electrical insulation of the thermal conduction plate 114. Additionally, the metallization layer may improve physical adhesion and/or improve robustness of the semiconductor package 100 against contaminant particles. This metallization layer may have a thickness of between 50 nm and 800 μm, and more preferably between about 20 μm and 300 μm. The metallization layer may comprise metals such as Al, Cu, Ag, W, Mo, Ni and alloys thereof. The metallization layer can be formed by any of a variety of techniques such as chemical vapor deposition, sputtering, thickfilm deposition, thinfilm deposition, direct bonding, active metal brazing, direct casting, etc.

In a sixth process step 210, the thermal conduction plate 114 is arranged on the semiconductor package 100 such that a region of the thermal interface material 118 is interposed between the thermal conduction plate 114 and the semiconductor die 102. This may be done in several ways. According to one technique, the surface of the semiconductor package 100 that is thermally coupled to the semiconductor die 102 is pre-coated with the thermal interface material 118. The surface of the semiconductor package 100 that is thermally coupled to the semiconductor die 102 may be a rear surface of the die pad 104 (if present) or a rear surface of the semiconductor die 102 (if no die pad 104 is present). After pre-coating the semiconductor package 100 with the thermal interface material 118, the thermal conduction plate 114 is placed on top of the thermal interface material 118. According to another technique that may be performed instead of or in combination with the previously described technique, a surface of the thermal conduction plate 114 is pre-coated with the thermal interface material 118 and the thermal conduction plate 114 is subsequently placed on the surface of the semiconductor package 100 that is thermally coupled to the semiconductor die 102.

In a seventh process step 212, after arranging the thermal conduction plate 114 on the semiconductor package 100, a further region of the thermal interface material 118 may be applied over the outer surface 116 of the thermal conduction plate 114 that faces away from the encapsulant body 106. This optional process step provides a further volume of the thermal interface material 118 that may further enhance thermal conductivity of the semiconductor package 100 when mounted and/or may fill any gaps between the thermal conduction plate 114 and the barrier 120 with the thermal interface material 118.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   a semiconductor die;
   an encapsulant body of electrically insulating material that encapsulates the semiconductor die;
   a thermal conduction plate comprising an outer surface that is exposed from the encapsulant body;
   a region of thermal interface material interposed between the thermal conduction plate and the semiconductor die, the region of thermal interface material being a liquid or semi-liquid; and
   a barrier that is configured to prevent the thermal interface material of the region from flowing laterally across the barrier,
   wherein the region of thermal interface material is disposed exclusively on one side of the thermal conduction plate,
   wherein the encapsulant body comprises a main surface, a rear surface opposite the main surface, and outer edge surfaces extending between the main surface and the rear surface,
   wherein the barrier comprises an inner wall that extends transversely to the main surface and faces the thermal interface material, and
   wherein the barrier comprises an electrically insulating structure that is separate from the encapsulant body.

2. The semiconductor package of claim 1, wherein the barrier is configured so that the inner wall forms an enclosed loop around the region of thermal interface material.

3. The semiconductor package of claim 1, wherein the barrier comprises a recess formed in the main surface of the encapsulant body, wherein the inner wall of the barrier comprises a sidewall of the recess, and wherein the region of thermal interface material is completely disposed below the main surface of the encapsulant body.

4. The semiconductor package of claim 1, wherein the semiconductor package further comprises a die pad, wherein the semiconductor die is mounted on the die pad, wherein a rear surface of the die pad that is opposite from the semiconductor die is exposed from the encapsulant body, and wherein the region of thermal interface material directly interfaces with the thermal conduction plate and the rear surface of the die pad.

5. The semiconductor package of claim 1, wherein the thermal interface material comprises an electrically insulating liquid matrix and one or both of: metal particles suspended in the liquid matrix, and metal wires suspended in the liquid matrix.

6. The semiconductor package of claim 5, wherein the metal particles and/or metal wires are coated with an electrically insulating material.

7. The semiconductor package of claim 1, wherein the thermal conduction plate is sintered body of ceramic material comprising any one or combination of a nitride ceramic, an oxide ceramic, a silicate ceramic, and a carbide material.

8. The semiconductor package of claim 1, wherein the thermal conduction comprises an organic insulation material.

9. A method of producing a semiconductor package, the method comprising:
   providing a semiconductor die;
   forming an encapsulant body of electrically insulating material that encapsulates the semiconductor die;
   forming a barrier;
   providing a thermal interface material that is liquid or semi-liquid;
   providing a thermal conduction plate that is electrically insulating and thermally conductive; and
   arranging the thermal conduction plate on the semiconductor package such that a first region of the thermal interface material is interposed between the thermal conduction plate and the semiconductor die, and
   wherein after the arranging the barrier is configured to prevent thermal interface material of the first region from flowing laterally across the barrier, and
   wherein after the arranging the region of thermal interface material is disposed exclusively on one side of the thermal conduction plate,
   wherein the barrier is formed as an integrally formed feature of the encapsulant body,
   wherein the encapsulant body is formed by performing a first molding process, and wherein the barrier is formed by performing a second molding process that is separate from first molding process.

10. The method of claim 9, wherein arranging the thermal conduction plate on the semiconductor package comprises pre-coating a surface of the semiconductor package that is thermally coupled to the semiconductor die with the thermal interface material and subsequently placing the thermal conduction plate on top of the thermal interface material.

11. The method of claim 9, wherein arranging the thermal conduction plate on the semiconductor package comprises pre-coating a surface of the thermal conduction plate with the thermal interface material and subsequently placing the thermal conduction plate on a surface of the semiconductor package that is thermally coupled to the semiconductor die.

12. The method of claim 9, further comprising forming a second region of the thermal interface material over an outer surface of the thermal conduction plate that faces away from the encapsulant body after arranging the thermal conduction plate on the semiconductor package.

13. The method of claim 9, wherein after the arranging the region of thermal interface material either the thermal conduction plate is disposed completely outside of the encapsulant body or the thermal conduction plate is disposed with a recess of the encapsulant body with outer edge sides of the thermal conduction plate directly contacting the encapsulant body.

14. A semiconductor package, comprising:
a semiconductor die;
an encapsulant body of electrically insulating material that encapsulates the semiconductor die;
a thermal conduction plate comprising an outer surface that is exposed from the encapsulant body;
a region of thermal interface material interposed between the thermal conduction plate and the semiconductor die, the region of thermal interface material being a liquid or semi-liquid; and
a barrier that is configured to prevent the thermal interface material of the region from flowing laterally across the barrier,
wherein the encapsulant body comprises a main surface,
wherein the barrier comprises an inner wall that extends transversely to the main surface and faces the thermal interface material,
wherein the barrier comprises a protrusion of the encapsulant body that extends above the main surface,
wherein the inner wall of the barrier is a sidewall of the protrusion, and
wherein the thermal conduction plate is mounted on top of the protrusion.

15. A method of producing a semiconductor package, the method comprising:
providing a semiconductor die;
forming an encapsulant body of electrically insulating material that encapsulates the semiconductor die;
forming a barrier;
providing a thermal interface material that is liquid or semi-liquid;
providing a thermal conduction plate that is electrically insulating and thermally conductive; and
arranging the thermal conduction plate on the semiconductor package such that a first region of the thermal interface material is interposed between the thermal conduction plate and the semiconductor die,
wherein the barrier comprises an inner wall that extends transversely to the main surface and faces the thermal interface material,
wherein the encapsulant body comprises a main surface,
wherein the barrier comprises a protrusion of the encapsulant body that extends above the main surface,
wherein the inner wall of the barrier is a sidewall of the protrusion, and
wherein the thermal conduction plate is mounted on top of the protrusion,
wherein after the arranging the barrier is configured to prevent thermal interface material of the first region from flowing laterally across the barrier.

* * * * *